(12) United States Patent
Chowdhury et al.

(10) Patent No.: US 7,915,175 B1
(45) Date of Patent: Mar. 29, 2011

(54) ETCHING NITRIDE AND ANTI-REFLECTIVE COATING

(75) Inventors: Saurabh Dutta Chowdhury, Dallas, TX (US); Helena Stadniychuk, Eagan, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 967 days.

(21) Appl. No.: 11/169,152

(22) Filed: Jun. 27, 2005

Related U.S. Application Data

(60) Provisional application No. 60/583,211, filed on Jun. 25, 2004.

(51) Int. Cl.
*H01L 21/461* (2006.01)
*H01L 21/302* (2006.01)
(52) U.S. Cl. ............... 438/724; 438/725; 257/E21.214
(58) Field of Classification Search ............ 438/723, 438/724, 725
See application file for complete search history.

(56) References Cited

U.S. PATENT DOCUMENTS

| | | | |
|---|---|---|---|
| 4,174,251 A | 11/1979 | Paschke | |
| 4,568,410 A | 2/1986 | Thornquist | |
| 4,654,114 A | 3/1987 | Kadomura | |
| 4,808,259 A | 2/1989 | Jillie, Jr. et al. | |
| 5,279,705 A | 1/1994 | Tanaka | |
| 5,639,687 A | 6/1997 | Roman et al. | |
| 5,924,000 A * | 7/1999 | Linliu | 438/592 |
| 5,928,967 A | 7/1999 | Radens et al. | |
| 5,989,979 A | 11/1999 | Liu et al. | |
| 6,130,146 A | 10/2000 | Chang et al. | |
| 6,174,590 B1 | 1/2001 | Iyer et al. | |
| 6,174,644 B1 | 1/2001 | Shieh et al. | |
| 6,235,456 B1 | 5/2001 | Obok | |
| 6,235,644 B1 | 5/2001 | Chou | |
| 6,296,780 B1 | 10/2001 | Yan et al. | |
| 6,307,174 B1 | 10/2001 | Yang et al. | |
| 6,379,872 B1 | 4/2002 | Hineman et al. | |
| 6,399,514 B1 | 6/2002 | Marks et al. | |
| 6,423,631 B1 | 7/2002 | Iyer et al. | |
| 6,428,716 B1 | 8/2002 | Demmin et al. | |
| 6,436,812 B1 | 8/2002 | Lee | |
| 6,451,703 B1 | 9/2002 | Liu et al. | |
| 6,461,969 B1 | 10/2002 | Lee et al. | |
| 6,699,795 B1 | 3/2004 | Schwarz et al. | |
| 6,841,491 B1 | 1/2005 | Sadoughi et al. | |
| 7,112,834 B1 | 9/2006 | Schwarz et al. | |
| 2001/0012667 A1 | 8/2001 | Ma et al. | |
| 2002/0006715 A1* | 1/2002 | Chhagan et al. | 438/585 |
| 2004/0242759 A1* | 12/2004 | Bhave | 524/556 |

OTHER PUBLICATIONS

Encyclopedia of Chemical Technology, Kirk-Othmer, vol. 14, pp. 677-709, (1995).
USPTO Notice of Allowance for U.S. Appl. No. 10/039,469 dated Aug. 26, 2004; 8 pages.
USPTO Non-Final Rejection for U.S. Appl. No. 10/039,469 dated Mar. 11, 2004; 11 pages.
USPTO Non-Final Rejection for U.S. Appl. No. 10/039,469 dated Jun. 16, 2003; 8 pages.
USPTO Notice of Allowance for U.S. Appl. No. 10/791,657 dated Jun. 8, 2006; 6 pages.
USPTO Non-Final Rejection for U.S. Appl. No. 10/791,657 dated Jan. 26, 2006; 5 pages.
USPTO Requirement for Restriction/Election for U.S. Appl. No. 10/791,657 dated Dec. 1, 2005; 4 pages.

(Continued)

*Primary Examiner* — Alexander G Ghyka

(57) ABSTRACT

A method of forming a semiconductor structure comprises etching an anti-reflective coating on a substrate with a first plasma comprising bromine and oxygen; and etching a nitride layer on the substrate with a second plasma comprising bromine and oxygen.

12 Claims, 3 Drawing Sheets

OTHER PUBLICATIONS

USPTO Corrected Notice of Allowance for U.S. Appl. No. 10/099,841 dated Oct. 7, 2003; 6 pages.

USPTO Notice of Allowance for U.S. Appl. No. 10/099,841 dated Oct. 2, 2003; 2 pages.

USPTO Final Rejection for U.S. Appl. No. 10/099,841 dated Apr. 15, 2003; 14 pages.

USPTO Non-Final Rejection for U.S. Appl. No. 10/099,841 dated Nov. 20, 2002; 11 pages.

USPTO Election/Restriction for Requirement for U.S. Appl. No. 10/099,841 dated Jun. 18, 2003; 2 pages.

Wolf et al., "Silicon Processing for the VLSI Era," vol. 1: Process Technology, 1999, pp. 550-556; 7 pages.

Robert F. Pierret, "Semiconductor Device Fundamentals," Addison-Wesley, 1996, pp. 525-539 and 149-174; 34 pages.

Peter Van Zant, "Microchip Fabrication: A Practical Guide to Semiconductor Processing," 2000, 3rd Ed., Chapter 16, pp. 491-527; 39 pages.

* cited by examiner

ETCHING NITRIDE AND ANTI-REFLECTIVE COATING

CROSS-REFERENCE TO RELATED APPLICATION

This application claims priority to provisional application Ser. No. 60/583,211, entitled "METHOD OF ETCHING NITRIDE AND AN ANTI-REFLECTIVE COATING WITH HIGH SELECTIVITY TO OXIDE" filed 25 Jun. 2004, the entire contents of which are hereby incorporated by reference, except where inconsistent with the present application.

BACKGROUND

In processing wafers or substrates to integrated circuits (ICs) or semiconductor devices, an antireflective coating (ARC) is typically present beneath a photoresist layer to reduce the reflection of light used to pattern the photoresist layer, as part of patterning a nitride layer, such as silicon nitride (see, for example, U.S. Pat. No. 6,841,491). Thus, one common requirement in manufacturing ICs is the etching of openings in the ARC and the nitride layer to form features such as vias, contacts and/or trenches. Typically, these openings or features are formed through openings in a photoresist pattern by plasma etching using an energized etchant gas (plasma). Common etchant gases for plasma etching ARCs include mixtures of gases containing fluorine, such as $C_4F_8$/$O_2$/$N_2$, $CHF_3$/$CF_4$/$O_2$/Ar, $C_2F_6$/Ar, or $SF_6$ (see, for example, U.S. Pat. No. 6,699,795).

Although conventional etch chemistries or recipes are satisfactory for etching ARCs, they have generally not been suitable for etching nitride layers. Openings through the ARC and the nitride layer typically cannot be etched with the same recipe, in which openings are etched in the ARC. Thus, etching openings in the ARC and the nitride layer have been performed in two separate steps. In particular, conventional ARC etch chemistries have not been suitable or capable of etching a nitride layer overlying a second underlying oxide dielectric layer, such as silicon oxide ($SiO_2$), with an acceptable selectivity to the underlying layer. Moreover, as the size of devices in ICs continues to shrink, the need for high selectivity is even more pronounced in order to etch nitride layers having areas of differing thicknesses, since the material underlying the thinner portions of the nitride will be exposed to the etch chemistry for longer periods of time.

Etch chemistries with fluorine containing gases are heavily polymerizing, and produce polymeric etch byproducts that deposit on the substrate and/or on surfaces in the chamber. These deposits can lead to defects in the substrates, which lower yields, and can lead to the need for more frequent cleaning of the chamber reducing substrate throughput. In addition, polymeric deposits on chamber walls are known to cause process shifts, drift and/or instability within the PM (preventive maintenance or cleaning) cycle of the chamber. Furthermore, alternating polymerizing and non-polymerizing processes often leads to flaking of the polymer deposited on the chamber, restrict or limit the running of these dissimilar etch chemistries in the same chamber.

SUMMARY

In a first aspect, the present invention is a method of forming a semiconductor structure, comprising etching an antireflective coating on a substrate with a first plasma comprising bromine and oxygen; and etching a nitride layer on the substrate with a second plasma comprising bromine and oxygen.

In a second aspect, the present invention is a method of forming a semiconductor structure, comprising etching an anti-reflective coating on a substrate with a first plasma; and etching a nitride layer on the substrate with a second plasma. The etching of the anti-reflective coating and the etching of the nitride layer both have an anti-reflective coating: $SiO_2$ etch selectivity of at least 5:1, and the etching of the anti-reflective coating and the etching of the nitride layer both have a nitride: $SiO_2$ etch selectivity of at least 3:1.

In a third aspect, the present invention is a method of etching an anti-reflective coating on a nitride layer with a first plasma, and etching the nitride layer which is on an oxide layer with a second plasma, where the oxide layer is on a substrate, and where the plasma contains fluorine and oxygen, the improvement comprising excluding fluorine from the plasma, and including bromine in the plasma.

DETAILED DESCRIPTION

The present invention makes use of the discovery that a plasma containing Br and O (for example, a plasma prepared from a gas containing $O_2$ and HBr) may be used to etch both an ARC and a nitride layer, with high selectivity to an oxide dielectric layer, such as a silica layer. This etch chemistry may be used to etch both an ARC and a nitride layer, in the same chamber and without stopping etching, maintaining plasma in the chamber when from the beginning of the ARC etch until the nitride etch is completed. Since the same etch chemistry may be used to etch both layers, the etchant gas (from which the plasma is formed) for both the ARC etch and the nitride etch may be substantially identical (and therefore the plasma composition may be substantially identical) and the etch selectivities of the ARC etch and the nitride etch (both ARC: oxide and nitride:oxide etch selectivities) may be substantially identical. Both etches have high selectivities (both ARC:oxide and nitride:oxide etch selectivities), and both etches have reduced polymeric etch byproducts, since the etchant gas is preferably substantially free of fluorine.

The ARC can include any suitable organic or inorganic material, for example silicon oxynitride or silicon-rich silicon nitride. Preferably, the ARC has a substantially uniform thickness across the substrate of from about 800 to about 1400 angstroms. Preferably, the nitride layer includes a layer of silicon nitride having a thickness of at least 200 angstroms, including from about 400 to about 500 angstroms. Typically, for DDLICME, the nitride layer thickness is 200 to 500 angstroms, and for SBME, the nitride layer thickness is 500 to 2000 angstroms.

Figure 1:
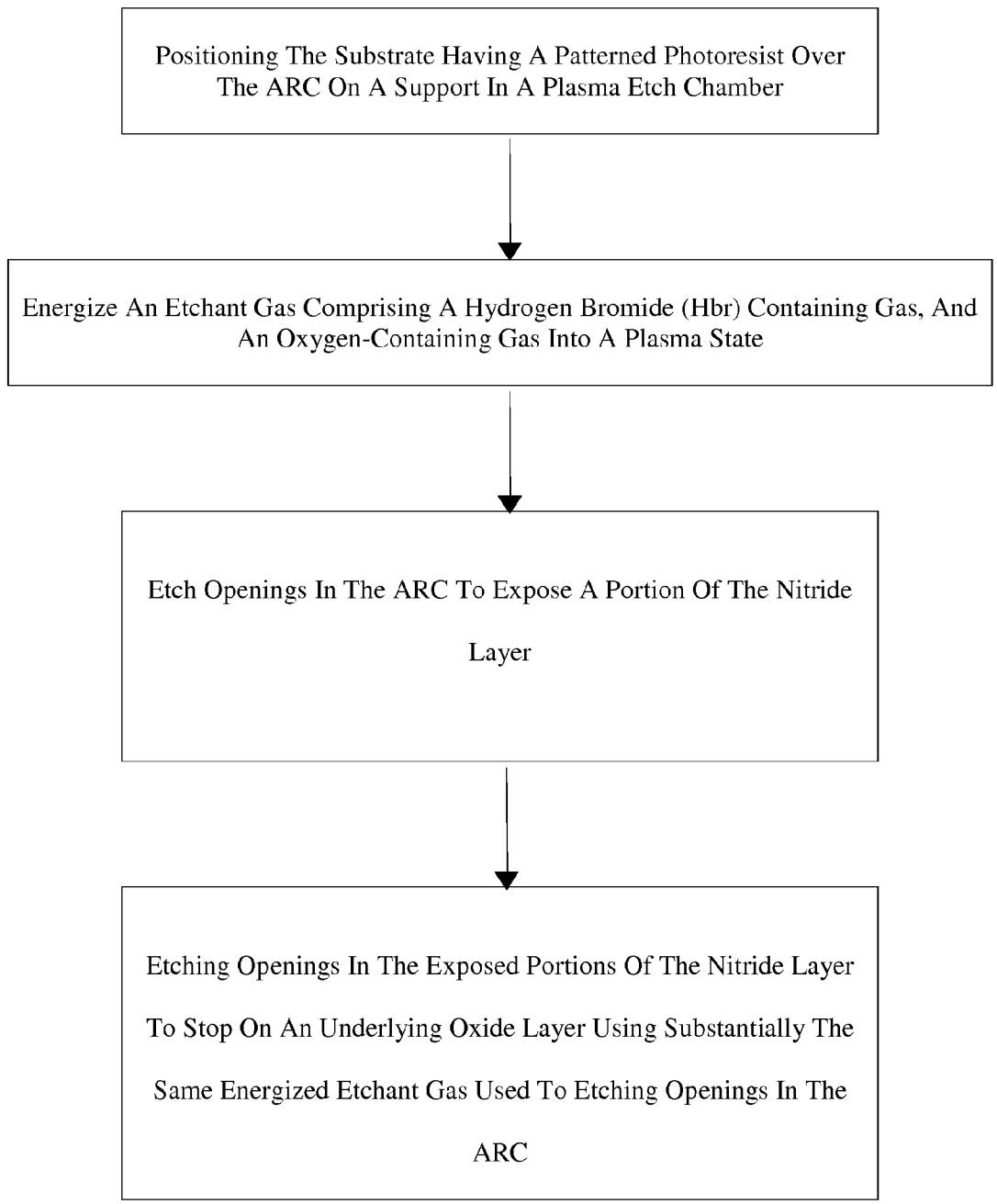
FIG. 1 is a flowchart of a process for etching a nitride layer and ARC on a substrate with high selectivity to an underlying oxide layer according to an embodiment of the present invention.

Referring to FIG. 1, an embodiment of the process involves a preliminary aspect of (i) placing or positioning the substrate having a patterned photoresist over the ARC on a support in a plasma etch chamber. This embodiment includes (ii) energizing an etchant gas into a plasma, the etchant gas containing a bromine-containing gas (such as a hydrogen bromide) and an oxygen-containing gas (such as $O_2$); (iii) etching openings in the ARC to expose a portion of the nitride layer; and (iv) etching openings in the exposed portions of the nitride layer to expose a portion of an underlying dielectric layer using substantially the same energized etchant gas used to etch openings in the ARC. Preferably, the etching of the nitride layer is performed simultaneously, in an uninterrupted process with etching of the ARC. More preferably, the etching of the nitride layer is performed with a high selectivity to an underlying oxide layer to stop thereon. The oxide layer can include, for example, a silicon dioxide ($SiO_2$) layer.

Optionally, the etchant gas (and therefore the plasma) may further include an inert carrier gas, such as helium (He) or argon (Ar). Preferably, the etchant gas does not contain, or is substantially free of, fluorine. If enough fluorine is present in the plasma (from fluorine-containing gas in the etchant gas), it will be detrimental, producing sufficient polymeric etch byproducts which will deposit on the substrate and/or on surfaces in the chamber, leading to defects in the substrates, the need for more frequent cleaning of the chamber, and may also cause process shifts, drift and/or instability within the PM (preventive maintenance or cleaning) cycle of the chamber.

The etchant gas mixture is energized to form a plasma by capacitively coupling radio frequency (RF) power to the etchant gas between a top and bottom electrode in a sealed process reactor or chamber of a suitable inductively coupled (ICP) plasma etch apparatus or system. Suitable ICP etch systems include, for example, a LAM9400 Etcher, commercially available from Lam Research Corporation of Fremont, Calif., and a DPS2 Etcher commercially available from Applied Materials Corporation of Santa Clara, Calif.

In one embodiment, the substrate is held on a support, such as an electrostatic chuck, and thermally coupled thereto by a heat transfer medium, such as He, applied to a backside of the substrate. Preferably, the chuck is cooled and the thermal coupling between the substrate and the chuck is sufficient to maintain a substrate temperature of from about 40 to about 70° C.

Parameters of an exemplary recipe for etching openings in both the ARC and an underlying nitride are provided in the Table I.

TABLE I

| Recipe Parameter (units) | Recipe range |
|---|---|
| Pressure (mt) | 4-20 |
| TCP RF (w) | 100-600 |
| Bias RF (w) | 50-300 |
| O2 (sccm) | 3-10 |

TABLE I-continued

| Recipe Parameter (units) | Recipe range |
|---|---|
| He or Ar (sccm) | 0-200 |
| HBr (sccm) | 100-300 |
| Back side He (torr) | 4-20 |
| Lower Electrode Temp (° C.) | 40-70 |

Preferably, the ratio of the flow rates of the bromine-containing gas:oxygen-containing gas (normalized for one bromine per gas molecule in the bromine-containing gas and two oxygens per oxygen-containing gas molecule) is 100-300: 3-10. Preferably, the ratio of the flow rates of the bromine-containing gas:inert carrier gas (normalized for one bromine per gas molecule in the bromine-containing gas) is 100-300: 0-200, and preferably the flow rates of the oxygen-containing gas:inert carrier gas (normalized for two oxygens per oxygen-containing gas molecule) is 3-10:0-200. Optionally or alternatively, the oxygen containing gas can include He $O_2$ at a flow rate of from about 15 to 20 sccm.

Figure 2:
FIG. 2 is an electron microscope image of a sectional side view of an opening etched in an ARC and an underlying nitride layer according to an embodiment of the present invention.
Figure 3:
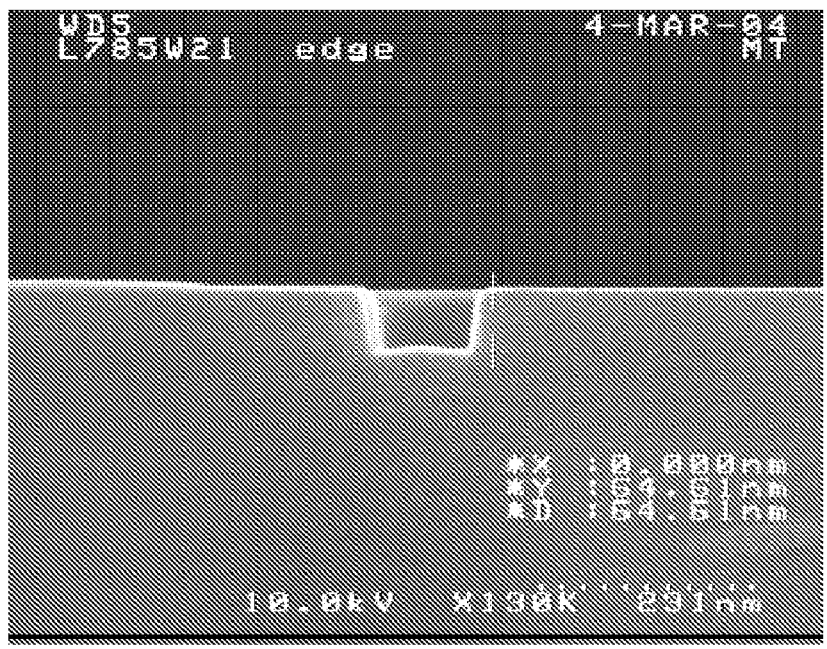
FIG. 3 is another electron microscope image of a sectional side view of an opening etched in an ARC and an underlying nitride layer according to another embodiment of the present invention.

Results of an ARC/nitride etch according an embodiment of the present invention and using the recipe of Table I are shown in FIGS. 2 and 3. FIG. 2 is an electron microscope image of a sectional side view of an opening etched in an ARC in a LAM9400 etcher according to an embodiment of the present invention. Similarly, FIG. 3 is another electron microscope image of a sectional side view of an opening etched in an ARC in DPS2 etcher according to another embodiment. Referring to FIGS. 2 and 3 it is seen that the ARC has been etched with a selectivity to $SiO_2$ (the ratio of the etch rate of the ARC to the etch rate of the $SiO_2$) of at least 5:1, including from 5:1 to 8:1, and the nitride (in this example silicon nitride) has been etched with a selectivity to $SiO_2$ (the ratio of the etch rate of the nitride to the etch rate of the $SiO_2$) of at least 3:1, including from 3:1 to 4:1. The oxide (in this example $SiO_2$) has been gouged less than about 70 Å. In addition, subsequent analysis of these substrates indicate a tunable etch bias of about 15 nanometers (nm), bottom undercut of less than 10 angstroms, top-to-bottom critical dimension (CD) difference (i.e., dimension at the top of the hole minus dimension of the bottom of the hole) of less than 15 nm, and a within wafer CD uniformity within 3 sigma of less than about 10 nm.

Figure 4:
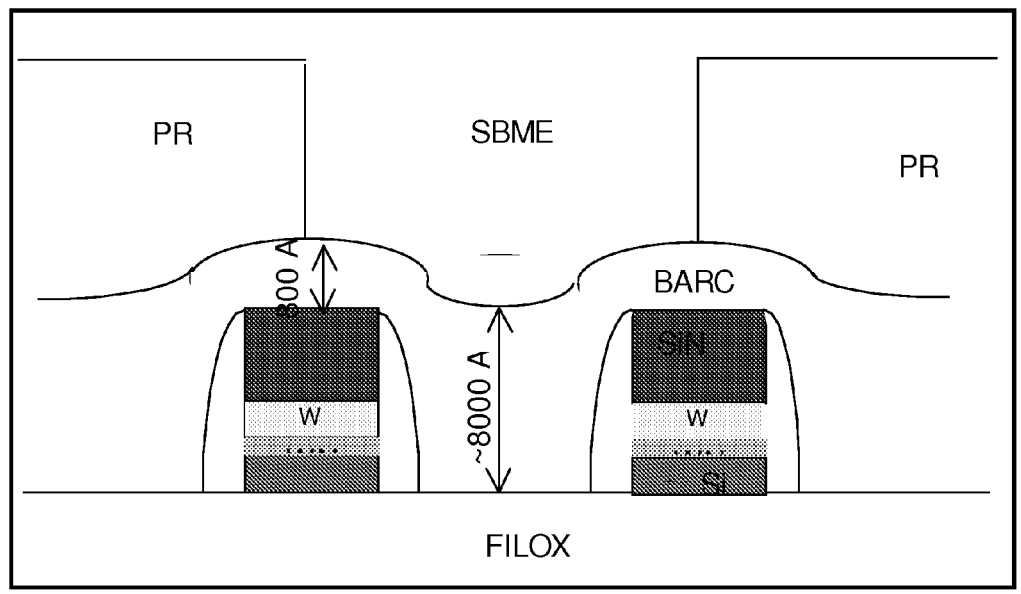
FIG. 4 is a schematic sectional side view of an interconnect formed using a silicide block mask etch (SBME) through an ARC and an underlying nitride layer, in which openings are etched in the ARC and nitride layer using an embodiment of the present invention.
Figure 5:
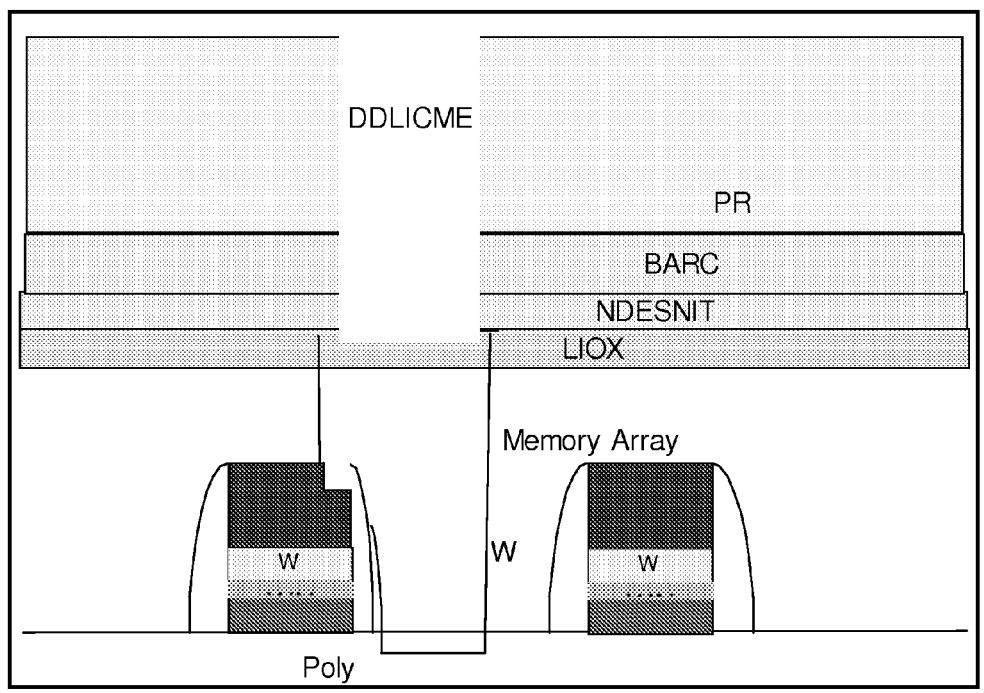
FIG. 5 is a schematic sectional side view of a dual damascene local interconnect (DDLIC) formed using an etch step (DDLICME), in which openings are etched in the ARC and the underlying nitride layer using an embodiment of the present invention.

In addition, it has been learned that the method of the present invention is particularly useful in etching openings in the ARC to form an interconnect using a silicide block mask etch (SBME), and in etches (DDLICME) used for forming a dual damascene local interconnect (DDLIC). FIG. 4 is a schematic sectional side view of an interconnect formed using a silicide block mask etch (SBME) through an ARC, in which openings are etched in the ARC using an embodiment of the present invention. FIG. 5 is a schematic sectional side view of a DDLIC formed using an etch (DDLICME), in which openings are etched in the ARC according to another embodiment of the invention.

Other processing may be used to complete formation of semiconductor devices from the semiconductor structure. For example, gate stacks and source/drain regions may be formed in the substrate, additional dielectric layers may be formed on the substrate, and contacts and metallization layers may be formed on these structures. These additional elements may be formed before, during, or after etching of an ARC and/or a nitride layer.

The related processing steps, including the etching of layers, polishing, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

The invention claimed is:

1. A method of forming a semiconductor structure, the method comprising:
    etching an anti-reflective coating that is positioned over a substrate with a first plasma comprising bromine and oxygen; and
    etching a nitride layer that is positioned over the substrate with a second plasma comprising bromine and oxygen, wherein an oxide layer is positioned over the substrate, the nitride layer is positioned over and in contact with the oxide layer, and the anti-reflective layer is positioned over the nitride layer.

2. The method of claim 1, wherein the etching of the anti-reflective coating and the etching of the nitride layer are both carried out in the same chamber.

3. The method of claim 2, wherein the etching of the anti-reflective coating and the etching of the nitride layer are carried out sequentially without stopping etching between the etchings.

4. The method of claim 1, wherein the first plasma is formed from a first etchant gas,
    the second plasma is formed from a second etchant gas, and
    both the first and the second etchant gases consist essentially of a bromine-containing gas and an oxygen-containing gas.

5. The method of claim 4, wherein both the first and the second etchant gases do not contain fluorine.

6. The method of claim 4, wherein the bromine-containing gas comprises HBr,
    the oxygen-containing gas comprises $O_2$, and
    both the first and the second etchant gases further consist essentially of an inert gas.

7. A method comprising first etching through an anti-reflective coating that is positioned over a nitride layer with a first plasma, the nitride layer positioned over and in contact with an oxide layer, and second etching the nitride layer with a second plasma, wherein the first and second etching forms a via through the anti-reflective coating and the nitride layer and wherein the first and second plasma contains bromine and oxygen.

8. A method of forming a semiconductor structure, the method comprising:
    etching an anti-reflective coating that is positioned over a substrate with a first plasma comprising bromine and oxygen; and
    etching a nitride layer that is positioned over the substrate with a second plasma comprising bromine and oxygen, wherein the anti-reflective layer is positioned over the nitride layer, wherein the first plasma is formed from a first etchant gas, the second plasma is formed from a second etchant gas, and both the first and the second etchant gases consist essentially of a bromine-containing gas and an oxygen-containing gas.

9. The method of claim 8, wherein the etching of the anti reflective coating and the etching of the nitride layer are both carried out in the same chamber.

10. The method of claim 9, wherein the etching of the anti-reflective coating and the etching of the nitride layer are carried out sequentially without stopping etching between the etchings.

11. The method of claim 8, wherein both the first and the second etchant gases do not contain fluorine.

12. The method of claim 8, wherein the bromine-containing gas comprises HBr, the oxygen-containing gas comprises $O_2$ and both the first and the second etchant gases further consist essentially of an inert gas.

* * * * *